(12) United States Patent
Noh et al.

(10) Patent No.: US 10,892,400 B2
(45) Date of Patent: Jan. 12, 2021

(54) MAGNETIC MEMORY DEVICE

(71) Applicant: Samsung Electronics Co., Ltd., Suwon-si (KR)

(72) Inventors: Eun-sun Noh, Yongin-si (KR); Ju-hyun Kim, Yongin-si (KR); Joon-myoung Lee, Anyang-si (KR); Woo-chang Lim, Seongnam-si (KR)

(73) Assignee: Samsung Electronics Co., Ltd.

( * ) Notice: Subject to any disclaimer, the term of this patent is extended or adjusted under 35 U.S.C. 154(b) by 43 days.

(21) Appl. No.: 16/512,503

(22) Filed: Jul. 16, 2019

(65) Prior Publication Data
US 2020/0185598 A1  Jun. 11, 2020

(30) Foreign Application Priority Data
Dec. 11, 2018 (KR) .................. 10-2018-0159037

(51) Int. Cl.
| | | |
|---|---|---|
| *H01L 43/04* | (2006.01) | |
| *H01L 27/22* | (2006.01) | |
| *H01L 43/06* | (2006.01) | |
| *H01L 43/10* | (2006.01) | |
| *G11C 11/16* | (2006.01) | |
| *H01F 10/32* | (2006.01) | |
| *H01F 41/30* | (2006.01) | |
| *G11C 11/18* | (2006.01) | |
| *H01L 43/14* | (2006.01) | |

(52) U.S. Cl.
CPC ............ *H01L 43/04* (2013.01); *G11C 11/161* (2013.01); *G11C 11/18* (2013.01); *H01F 10/329* (2013.01); *H01F 10/3272* (2013.01); *H01F 41/302* (2013.01); *H01L 27/224* (2013.01); *H01L 27/228* (2013.01); *H01L 43/06* (2013.01); *H01L 43/10* (2013.01); *H01L 43/14* (2013.01); *H01F 10/3286* (2013.01)

(58) Field of Classification Search
None
See application file for complete search history.

(56) References Cited

U.S. PATENT DOCUMENTS 9,236,105 B2 * 1/2016 Pi .................. G11C 11/161
9,460,397 B2   10/2016 Apalkov et al.
9,530,478 B2   12/2016 Pi et al.
(Continued)

FOREIGN PATENT DOCUMENTS

JP  6103123  3/2017
JP  6290487  3/2018

OTHER PUBLICATIONS

Khang et al. "A conductive topological insulator with colossal spin Hall effect for ultra-low power spin-orbit-torque switching" Nature Materials 17:808-813 (2018).
(Continued)

*Primary Examiner* — Michelle Mandala
*Assistant Examiner* — Jordan M Klein
(74) *Attorney, Agent, or Firm* — Myers Bigel, P.A.

(57) ABSTRACT

A magnetic memory device includes a buffer layer on a substrate, a magnetic tunnel junction structure including a fixed layer structure, a tunnel barrier, and a free layer that are sequentially arranged on the buffer layer, and a spin-orbit torque (SOT) structure on the magnetic tunnel junction structure and including a topological insulator material, wherein the free layer includes a Heusler material.

20 Claims, 16 Drawing Sheets

(56) References Cited

U.S. PATENT DOCUMENTS

| | | | |
|---|---|---|---|
| 2018/0033953 A1 | 2/2018 | Sasaki et al. | |
| 2018/0123026 A1 | 5/2018 | Sasaki et al. | |
| 2018/0123028 A1* | 5/2018 | Shiokawa | H01L 43/06 |
| 2018/0174634 A1 | 6/2018 | Kato et al. | |
| 2018/0190899 A1 | 7/2018 | Kim et al. | |
| 2018/0219152 A1 | 8/2018 | Apalkov et al. | |
| 2018/0268886 A1 | 9/2018 | Ishikawa et al. | |
| 2019/0137576 A1 | 5/2019 | Sasaki | |
| 2019/0147929 A1* | 5/2019 | Sasaki | H01L 43/02 |
| | | | 365/158 |
| 2019/0148629 A1* | 5/2019 | Sasaki | G11C 11/18 |
| | | | 257/421 |
| 2020/0136018 A1* | 4/2020 | Ying | G11C 11/1657 |
| 2020/0161542 A1* | 5/2020 | Ahn | H01F 41/307 |
| 2020/0243752 A1* | 7/2020 | Sasaki | H01L 29/82 |
| 2020/0266336 A1* | 8/2020 | Nakada | H01L 27/222 |

OTHER PUBLICATIONS

Mao et al. "MnGa-based fully perpendicular magnetic tunnel junctions with ultrathin Co2MnSi interlayers" Scientific Reports 7:43064 (2017).

* cited by examiner

IIA - IIA'

IIB - IIB'

IIA - IIA'

MAGNETIC MEMORY DEVICE

CROSS-REFERENCE TO RELATED APPLICATION

This application claims the benefit of Korean Patent Application No. 10-2018-0159037, filed on Dec. 11, 2018, in the Korean Intellectual Property Office, the disclosure of which is incorporated herein in its entirety by reference.

BACKGROUND

The inventive concepts relate to a magnetic memory device, and more particularly, to a magnetic memory device including a magnetic tunnel junction (MTJ).

Studies have been made on electronic devices that utilize magneto-resistance characteristics of MTJs. Particularly, as MTJ cells of a highly integrated magnetic random-access memory (MRAM) device are miniaturized, MRAM devices have been proposed in which information is stored by programming the MTJ cells by using spin-orbit torque. Fast switching and a low current operation may be requirements for such MRAM devices.

SUMMARY

The inventive concepts provide a magnetic memory device capable of fast switching and a low current operation.

According to an aspect of the inventive concepts, there is provided a magnetic memory device including: a buffer layer on a substrate; a magnetic tunnel junction structure including a fixed layer structure, a tunnel barrier, and a free layer that are sequentially arranged on the buffer layer; and a spin-orbit torque (SOT) structure on the magnetic tunnel junction structure and including a topological insulator material, wherein the free layer includes a Heusler material.

According to another aspect of the inventive concepts, there is provided a magnetic memory device including: a buffer layer on a substrate; a magnetic tunnel junction structure arranged on the buffer layer, the magnetic tunnel junction including a fixed layer structure, a tunnel barrier, and a free layer, which are sequentially arranged on the buffer layer; and a spin-orbit torque (SOT) structure arranged on the magnetic tunnel junction structure, the SOT structure including: a first electrode layer on the magnetic tunnel junction structure and including a ferrimagnetic Heusler material; and a second electrode layer on the first electrode layer and including a topological insulator material.

According to another aspect of the inventive concepts, there is provided a magnetic memory device including: a buffer layer on a substrate; a fixed layer structure on the buffer layer and including a ferrimagnetic Heusler material; a tunnel barrier on the fixed layer structure; a free layer on the tunnel barrier and including a ferrimagnetic Heusler material; and a spin-orbit torque (SOT) structure on the free layer and including a topological insulator material.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Hereinafter, embodiments of the inventive concepts will be described in detail with reference to the accompanying drawings.

Figure 1:
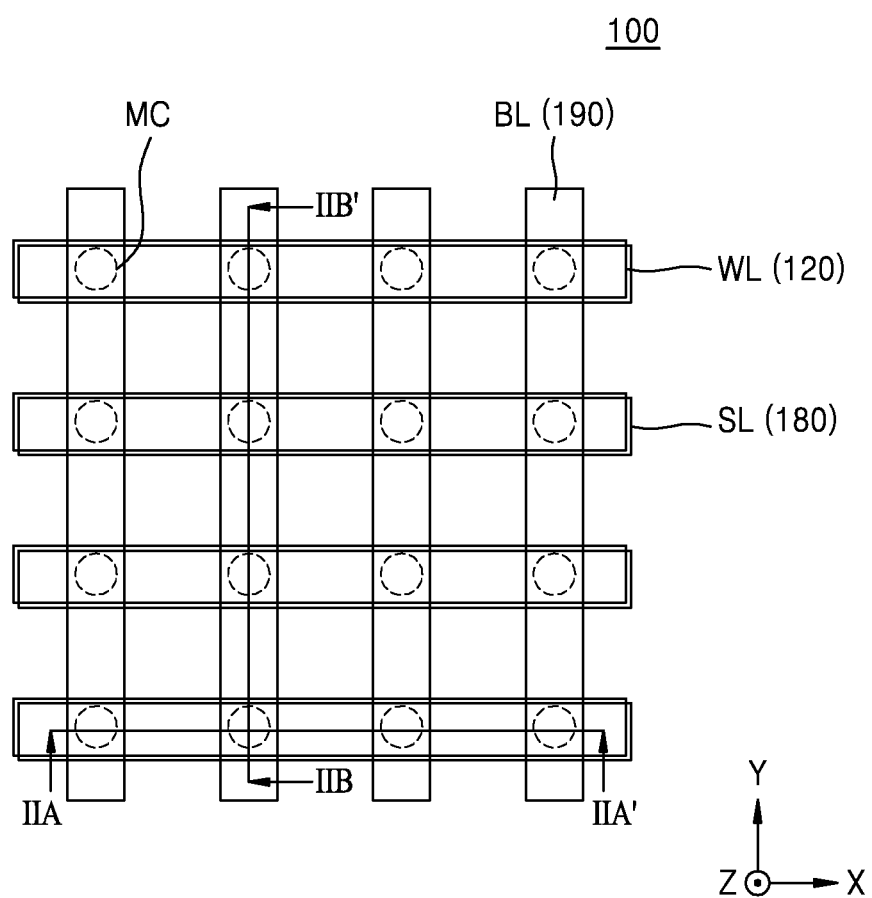
FIG. 1 is a layout diagram illustrating a magnetic memory device according to an example embodiment.
Figure 2A:
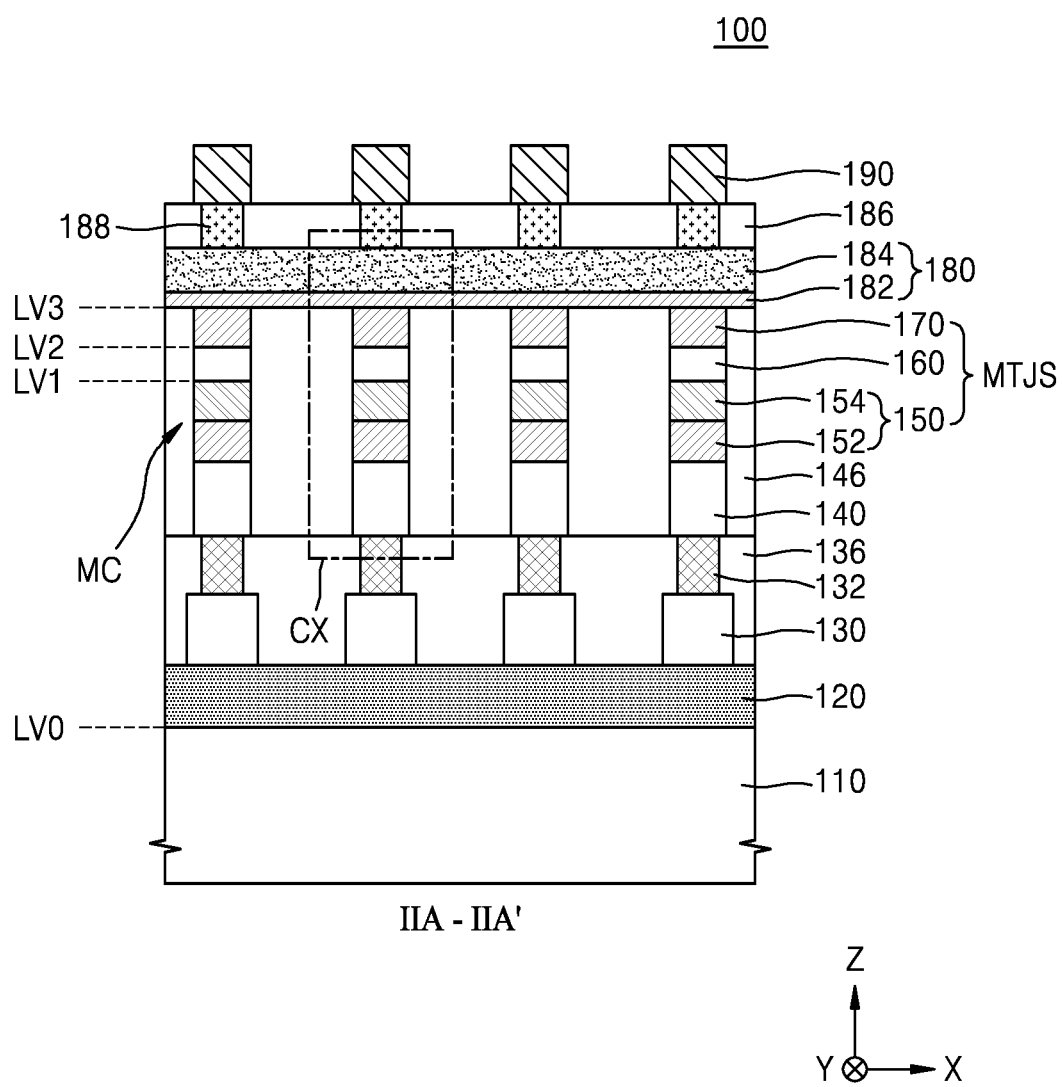
FIG. 2A is a cross-sectional view taken along line IIA-IIA' in FIG. 1.
Figure 2B:
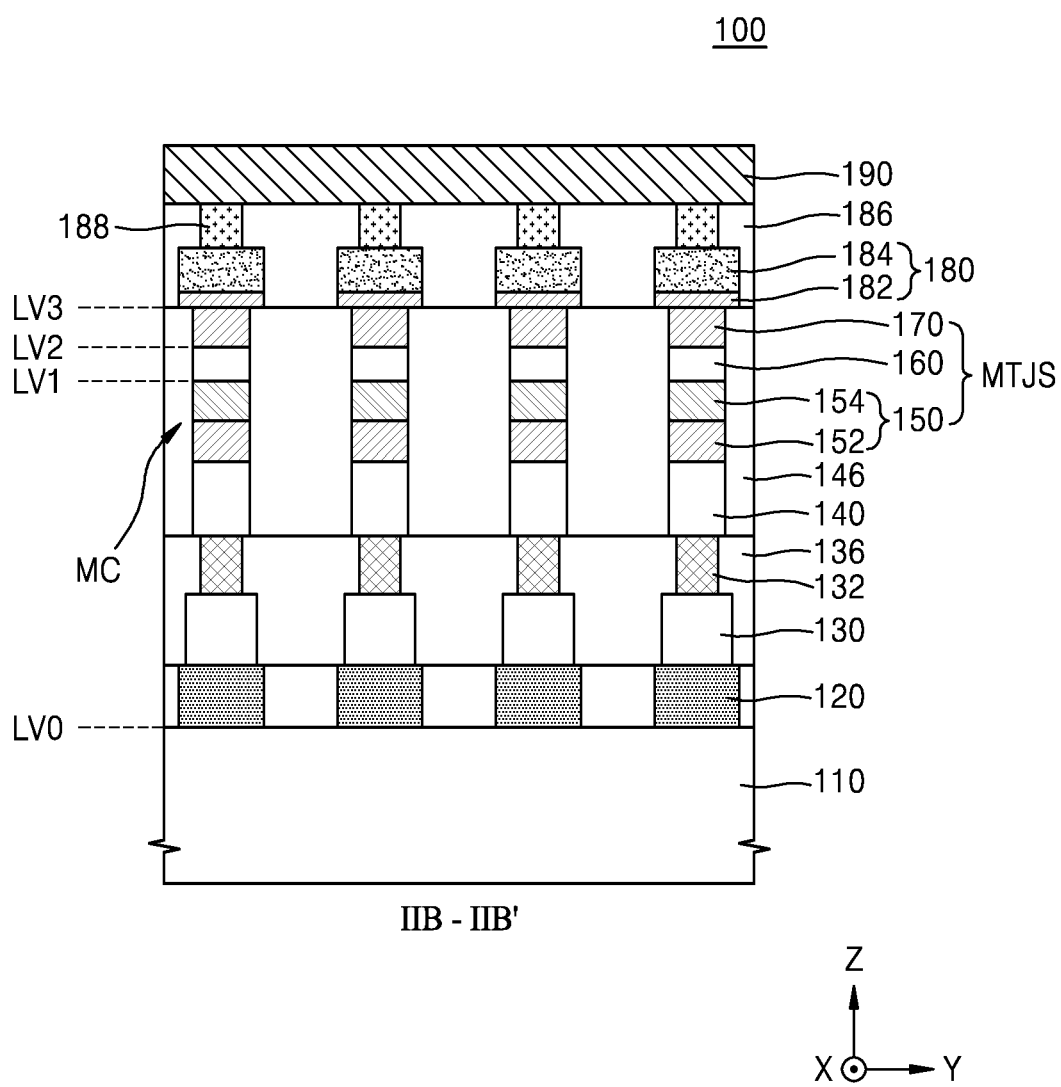
FIG. 2B is a cross-sectional view taken along line IIB-IIB' in FIG. 1.
Figure 3:
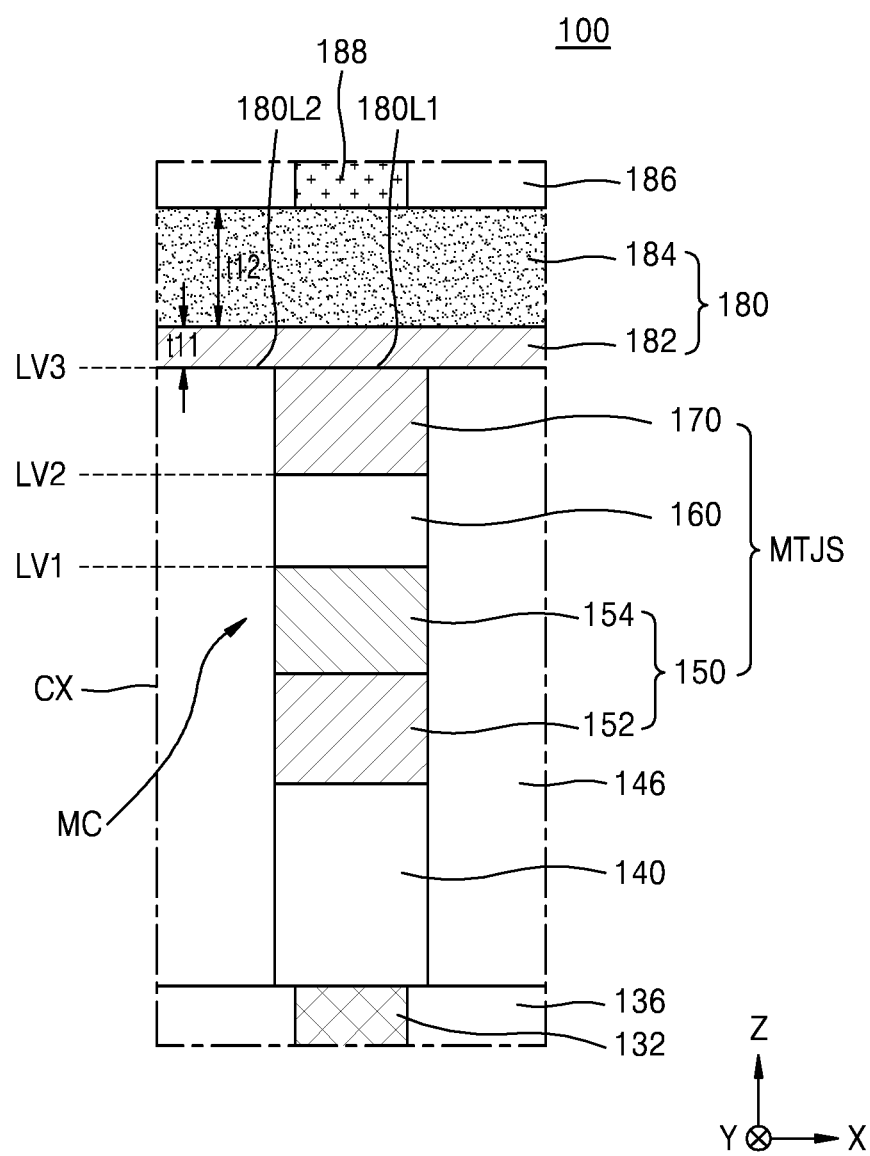
FIG. 3 is an enlarged view of a region CX in FIG. 2A.

FIG. 1 is a layout diagram illustrating a magnetic memory device 100 according to an example embodiment. FIG. 2A is a cross-sectional view taken along line IIA-IIA' in FIG. 1, and FIG. 2B is a cross-sectional view taken along line IIB-IIB' in FIG. 1. FIG. 3 is an enlarged view of a region CX in FIG. 2A.

Referring to FIGS. 1 through 3, the magnetic memory device 100 may include a word line WL, a memory cell MC, and a spin-orbit torque (SOT) line SL, and a bit line BL, that are on/over a substrate 110. The word lines WL and the bit lines BL may be arranged to intersect each other, and a plurality of memory cells MC may be between the word lines WL and the bit lines BL (or may be at the intersections of the word lines WL and the bit lines BL in a plan view). As illustrated in FIG. 1, the magnetic memory device 100 may have a cross-point array structure.

For example, the word line WL may extend in a first direction (X direction) on the substrate 110, and the bit line BL may extend in a second direction (Y direction) at a higher level than the word line WL. The SOT line SL may be between the bit line BL and the memory cell MC, and may extend, for example, in the first direction (X direction). The terms first, second, etc. may be used herein to distinguish one element from another element.

The SOT line SL may include a non-magnetic material having high spin-orbit coupling characteristics and function as a source line of SOT in a SOT-type MRAM device. In the SOT-type MRAM device, when a current flows through the SOT line SL, a free layer 170 may be switched through the spin Hall effect, that is, a phenomenon of spin polarization appearing perpendicular to a direction of the current which interacts with a spin in an SOT line SL lattice in contact with the SOT line SL.

As illustrated in FIG. 2A, a first conductive line 120 may be on the substrate 110, and a plurality of switching elements 130 may be on the first conductive line 120. An intermediate layer such as an interlayer insulating layer may be further arranged on the substrate 110, and the interlayer insulating layer may be between the substrate 110 and the first conductive line 120.

The first conductive line 120 may correspond to the word line WL in FIG. 1. The first conductive line 120 may include a conductive material such as doped polysilicon, titanium, titanium nitride, tantalum, tantalum nitride, titanium tungsten, tungsten, aluminum, cobalt, and/or nickel.

The plurality of switching elements 130 may be configured to selectively control a current passing through the memory cell MC. In example embodiments, the plurality of switching elements 130 may include PMOS transistors or NMOS transistors. In this case, some of the plurality of switching elements 130 may be inside the substrate 110 (e.g., may include regions that are on or in the substrate 110), and a wiring structure for electrically connecting the first conductive line 120 to the plurality of switching elements 130 may be further formed. In other embodiments, the plurality of switching elements 130 may include diodes or ovonic threshold switching (OTS) devices.

A plurality of bottom electrodes 132 may be on the plurality of switching elements 130, respectively. The plurality of bottom electrodes 132 may electrically connect the plurality of switching elements 130 to the plurality of memory cells MC. For example, the plurality of bottom electrodes 132 may include at least one of TiN, Ti, TaN, Ta, Ru, or W. Elements listed using the terminology "at least one of" followed by "or" include any and all combinations of one or more of the associated listed elements, and may also be designated herein by the term "and/or."

A first interlayer insulating layer 136 covering the first conductive line 120, the plurality of switching elements 130, and the plurality of bottom electrodes 132 may be on the substrate 110. A top surface of the first interlayer insulating layer 136 may be at the same level as top surfaces of the plurality of bottom electrodes 132, and the first interlayer insulating layer 136 may cover a sidewall of the plurality of bottom electrodes 132. The first interlayer insulating layer 136 may have a stacked structure including a plurality of insulating layers.

Each of the plurality of memory cells MC may include a buffer layer 140 and an MTJ structure (MTJS) that are sequentially arranged on each of the plurality of bottom electrodes 132. The plurality of memory cells MC may be between the word lines WL and the bit lines BL. As illustrated in FIG. 1, a horizontal cross-section of the plurality of memory cells MC may be circular, but embodiments are not limited thereto, and the horizontal cross-section of the plurality of memory cells MC may have various shapes such as a rectangle, a triangle, a trapezoid, or other polygon. A width in the first direction (X direction) of each of the plurality of memory cells MC may be greater than a width in the first direction (X direction) of each of the plurality of bottom electrodes 132, but embodiments are not limited thereto. Unlike illustrated in FIGS. 2A and 2B, the width in the first direction (X direction) of each of the plurality of memory cells MC may be the same as the width in the first direction (X direction) of each of the plurality of bottom electrodes 132.

The buffer layer 140 may be on each of the plurality of bottom electrodes 132. The buffer layer 140 may be used as a growth template in a process of forming the MTJ structure MTJS for excellent crystal quality thereof. The buffer layer 140 may include a non-magnetic metal material (such as chromium (Cr), ruthenium (Ru), and/or tantalum (Ta)), a non-magnetic compound (such as cobalt gallium (CoGa) and/or manganese gallium nitride (MnGaN)), and/or a non-magnetic alloy (such as nickel aluminum (NiAl)).

The MTJ structure may include a fixed layer structure 150, a tunnel barrier 160, and a free layer 170, which are sequentially arranged on the buffer layer 140.

The fixed layer structure 150 may include a fixed magnetization easy axis and have a fixed magnetization direction. For example, the fixed layer structure 150 may have the magnetization easy axis in a third direction (Z direction) and may include a perpendicular magnetic anisotropy (PMA) material. The free layer 170 may have a magnetization direction that varies depending on conditions. For example, the free layer 170 may have the magnetization easy axis that varies in the third direction (Z direction). In this case, a perpendicular-type magnetic memory device may be implemented. In other embodiments, the fixed layer structure 150 may have the magnetization easy axis in the first direction (X direction), and the free layer 170 may have a variable magnetization easy axis in the first direction (X direction). In this case, a horizontal-type magnetic memory device may be implemented.

A resistance value of the MTJ structure may depend on a magnetization direction of the free layer 170. When the magnetization direction of the free layer 170 is parallel to the magnetization direction of the fixed layer structure 150, the MTJ structure may have a low resistance value and store data of '0'. When the magnetization direction of the free layer 170 is anti-parallel to the magnetization direction of the fixed layer structure 150, the MTJ structure may have a high resistance value and store data of '1'.

In example embodiments, the fixed layer structure 150 may have a stacked structure including a bottom fixed layer 152 and a top fixed layer 154. Both the bottom fixed layer 152 and the top fixed layer 154 may include a ferrimagnetic Heusler material. The ferrimagnetic Heusler material may refer to a manganese-based alloy having a tetragonal crystal phase and may include a manganese-based alloy including, for example, a $D0_{22}$ crystal structure. Here, the term 'alloy' may refer to not only a substance in which different kinds of metal elements are mixed to have a regular crystal structure, but also a material in which at least one metal element and at least one non-metal element are mixed to have a regular crystal structure.

The bottom fixed layer 152 may contact the buffer layer 140 and include a binary ferrimagnetic Heusler material. The bottom fixed layer 152 may include a binary ferrimagnetic Heusler material having a chemical formula of $Mn_aX_b$, and a high perpendicular magnetic anisotropy and/or a low damping characteristic (for example, a low Gilbert damping characteristic). In the chemical formula above, atomic contents, a and b, of Mn and X may have various values, respectively. For example, the bottom fixed layer 152 may include at least one of manganese gallium (MnGa) or manganese germanium (MnGe).

The top fixed layer 154 may be on the bottom fixed layer 152 and include a ternary ferrimagnetic Heusler material. The top fixed layer 154 may include a ternary ferrimagnetic Heusler material having a chemical formula of $Mn_aX_bY_c$, a high perpendicular magnetic anisotropy, and/or a low damping characteristic. The letter Y may refer to magnetic metal elements such as cobalt, nickel, or iron. In the chemical formula above, atomic contents, a, b, and c, of Mn, X, and Y may have various values, respectively. For example, the top fixed layer 154 may include at least one of MnGaNi, MnGeNi, MnGaCo, MnGeCo, MnGaFe, or MnGeFe.

Since both the bottom fixed layer 152 and the top fixed layer 154 include a ferrimagnetic Heusler material, both the bottom fixed layer 152 and the top fixed layer 154 formed on the buffer layer 140 may have excellent crystal quality. In addition, a stacked structure of the bottom fixed layer 152 and the top fixed layer 154 may have high perpendicular magnetic anisotropy due to relatively high exchange coupling, and accordingly, the fixed layer structure 150 may have high tunnel magnetoresistance (TMR).

A tunnel barrier 160 may be on the fixed layer structure 150. The tunnel barrier 160 may have a thickness less than a spin diffusion length. For example, the tunnel barrier 160 may have a thickness of about 1 to about 20 nm in the third direction (Z direction) perpendicular to a top surface of the substrate 110.

The tunnel barrier 160 may include a non-magnetic material. In example embodiments, the tunnel barrier 160 may include at least one of an oxide (such as an oxide of magnesium (Mg), titanium (Ti), aluminum (Al), magnesium-zinc (MgZn), and/or magnesium-boron (B)), or a nitride (such as a nitride of titanium (Ti) and/or vanadium (V)). For example, the tunnel barrier 160 may include a magnesium oxide (MgO) layer or a magnesium oxide aluminum (MgAlO) layer. Alternatively, the tunnel barrier 160 may include a plurality of layers. For example, the tunnel barrier 160 may have a stacked structure including Mg/MgO, MgO/Mg, MgO/MgAlO, MgAlO/MgO, Mg/MgAlO/Mg, MgO/MgAlO/MgO, MgAlO/MgO/MgAlO, etc. The tunnel barrier 160 may have a NaCl crystal structure (face-centered cubic lattice structure).

In some embodiments, the tunnel barrier 160 may include magnesium aluminum oxide (MgAlO), and in this case, a lattice mismatch between the top fixed layer 154 including a ferrimagnetic Heusler material and the tunnel barrier 160 may be relatively small.

The free layer 170 may be on the tunnel barrier 160. The free layer 170 may include a ferrimagnetic Heusler material. The free layer 170 may include a manganese-based alloy having a tetragonal crystal phase and include a manganese-based alloy including the $D0_{22}$ crystal structure. The free layer 170 may include a binary ferrimagnetic Heusler material having a chemical formula of $Mn_aX_b$, and high perpendicular magnetic anisotropy and/or a low damping characteristic. In the chemical formula above, atomic contents, a and b, of Mn and X may have various values, respectively. For example, the free layer 170 may include at least one of MnGa or MnGe.

In example embodiments, since the lattice mismatch between the free layer 170 and the tunnel barrier 160 is relatively small and the tunnel barrier 160 has a relatively small thickness, the free layer 170 may be formed by using the fixed layer structure 150 on a bottom surface of the tunnel barrier 160 as the growth template. Since the fixed layer structure 150 includes a ferrimagnetic Heusler material of the $D0_{22}$ crystal structure, the free layer 170 may also have the $D0_{22}$ crystal structure of good crystal quality. In addition, the interface quality between the free layer 170 and the tunnel barrier 160 may also be good. In addition, the free layer 170 may include the binary ferrimagnetic Heusler material that exhibits high perpendicular magnetic anisotropy and low damping characteristics, and accordingly, a switching operation at a low current may be implemented by using the MTJ structure including the free layer 170.

As illustrated in FIG. 3, sidewalls of the buffer layer 140, sidewalls of the fixed layer structure 150, sidewalls of the tunnel barrier 160, and sidewalls of the free layer 170 may be aligned with respect to each other in straight lines. This alignment may be possible because a preliminary buffer layer 140P (refer to FIG. 9), a preliminary bottom fixed layer 152P (refer to FIG. 9), a preliminary top fixed layer 154P (refer to FIG. 9), a preliminary tunnel barrier 160P (refer to FIG. 9), and a preliminary free layer 170P (refer to FIG. 9) are sequentially formed, and then patterned to form the plurality of memory cells MC including the buffer layer 140, the fixed layer structure 150, the tunnel barrier 160, and the free layer 170.

An insulating pattern 146 may be on the first interlayer insulating layer 136 to surround sidewalls of the plurality of memory cells MC. The insulating pattern 146 may surround the sidewalls of the buffer layer 140 and the sidewalls of the MTJ structure, and a top surface of the insulating pattern 146 may be at the same level as a top surface of the free layer 170. As used herein, an element that surrounds or covers another element may partially or completely surround or cover the element.

An SOT structure 180 extending in the second direction (Y direction) may be on the MTJ structure and the insulating pattern 146. The SOT structure 180 may include a first electrode layer 182 and a second electrode layer 184 that are sequentially stacked, and both the first and second electrode layers 182 and 184 may extend in the second direction. The SOT structure 180 may correspond to the SOT line SL in FIG. 1.

The second electrode layer 184 may include a non-magnetic material having spin-orbit coupling characteristics and include, for example, a topological insulator material. The topological insulator material may have insulating property therein due to a particular crystallographic order, while portions adjacent to a surface thereof generally include a conductive material. For example, portions adjacent to the top surface and the bottom surface of the second electrode layer 184 may exhibit conductivity, while the other portions of the second electrode layer 184 may exhibit insulating properties. In example embodiments, the second electrode layer 184 may include at least one of bismuth antimony ($Bi_{1-x}Sb_x$, where x is about 0.05 to about 0.25) or bismuth selenium ($Bi_{1-y}Se_y$, where y is about 0.05 to about 0.25). The second electrode layer 184 may have a relatively high spin Hall angle value. The second electrode layer 184 may have a high spin Hall angle value of about 0.5 or more, for example, about 2 or more, or about 5 or more, but embodiments are not limited thereto.

The first electrode layer 182 may function as a buffer layer to improve the interface characteristics between the second electrode layer 184 and the MTJ structure (or the free layer 170). In example embodiments, the first electrode layer 182 may include a binary ferrimagnetic Heusler material such as MnGe and/or MnGa. In other embodiments, the first electrode layer 182 may include a ternary ferrimagnetic Heusler material such as MnGaNi, MnGeNi, MnGaCo, MnGeCo, MnGaFe, and/or MnGeFe.

The second electrode layer 184 may transfer a spin current to the free layer 170 by using the spin Hall effect. The second electrode layer 184 may include a topological insulator material, and the topological insulator material, as a source of spin-orbit torque, may exhibit higher spin-orbit coupling characteristics than a generally used metal material having the spin Hall effect such as tantalum, tungsten, and/or platinum. For example, the second electrode layer 184 may have a relatively higher spin Hall angle value compared with a generally used metal material having the spin Hall effect such as tantalum, tungsten, and platinum. The magnetic memory device 100 may be driven at a low current or low power, as the second electrode layer 184 uses a topological isolating material having good spin-orbit coupling characteristics.

As illustrated in FIG. 3, the first electrode layer 182 may have a first thickness t11 in the third direction (Z direction) perpendicular to a top surface of the substrate 110, and the second electrode layer 184 may have a second thickness t12 greater than the first thickness t11 in the direction (Z direction). The first thickness t11 may be about 1 to about 10 nm, but is not limited thereto.

The SOT structure 180 may include a first bottom surface 180L1 on the free layer 170 and a second bottom surface 180L2 on the insulating pattern 146. The entire top surface of the free layer 170 may contact the bottom surface of the SOT structure 180, that is, the first bottom surface 180L1. An entire bottom surface of the second electrode layer 184 may be on the first electrode layer 182, the second electrode layer 184 may not be in contact with the insulating pattern 146, and the first electrode layer 182 may be on the top surfaces of the insulating pattern 146 and the free layer 170. Since the first electrode layer 182 includes a manganese-based alloy having a tetragonal crystal phase and has the same crystal structure as the material included in the free layer 170, flatness and crystal quality of the second electrode layer 184 may be good and interface characteristics between the first electrode layer 182 and the second electrode layer 184 may be good.

A second interlayer insulating layer 186 may be on the SOT structure 180 and above the insulating pattern 146.

A second conductive line 190 extending in the second direction (Y direction) may be on the second interlayer insulating layer 186, and a plurality of contacts 188 penetrating the second interlayer insulating layer 186 may connect the SOT structure 180 to the second conductive line 190. The second conductive line 190 may correspond to the bit line BL in FIG. 1. Each of the plurality of contacts 188 may be arranged at a position vertically overlapping each of the plurality of MTJ structures MTJS.

The plurality of contacts 188 and the second conductive line 190 may include a conductive material such as doped polysilicon, titanium, titanium nitride, tantalum, tantalum nitride, titanium tungsten, tungsten, aluminum, cobalt, and/or nickel. In example embodiments, the SOT structure 180 including the topological insulator material may have a relatively low resistivity and be apart from the second conductive line 190, and the amount of current flowing in the SOT structure 180 may be increased compared with, for example, a case in which the second conductive line 190 and the SOT structure 180 are formed in a stacked manner or in contact with each other. However, the inventive concepts are not limited thereto.

As illustrated in FIG. 3, a top surface level LV3 of the free layer 170 may be higher than a top surface level LV1 of the fixed layer structure 150 with respect to a top surface level LV0 of the substrate 110, and a bottom surface level of the SOT structure 180 (that is, top surface level LV3) may be higher than a top surface level LV2 of the tunnel barrier 160. According to example embodiments, the SOT structure 180 may be arranged at a higher level than the MTJ structure, and accordingly, the SOT structure 180 may not be damaged in a patterning process of the MTJ structure.

Generally, in an MRAM device of an SOT type, a SOT line may be on the switching element, and an MTJ structure in which a free layer, a tunnel barrier, and a fixed layer are sequentially included may be arranged on the SOT line. In an etching process of patterning the MTJ structure, etching residues that generally include heavy metal materials may be re-deposited on patterned sidewalls to cause a short between the free layer and the fixed layer, and a top surface of the SOT line exposed to an etching environment may be damaged by an etching gas or an etchant. However, according to example embodiments, the SOT structure 180 may be arranged at a higher level than the MTJ structure MTJS, and accordingly, the SOT structure 180 may be prevented from being damaged in the patterning process of the MTJ structure MTJS.

In addition, generally, in the MRAM device of the SOT type, a SOT line may be on the switching element, and an MTJ structure in which a free layer, a tunnel barrier, and a fixed layer are sequentially included may be arranged on the SOT line. In particular, since the SOT line and the free layer need to be in contact with each other without an additional material layer therebetween, it may be difficult to arrange a buffer layer for improving crystallinity of the free layer, and accordingly, crystal quality of the free layer may be relatively low and there may be restrictions in selecting a material to be used for the free layer. Particularly, although a ferrimagnetic Heusler material has a low damping property and high perpendicular magnetic anisotropy, forming a ferrimagnetic Heusler material of good crystal characteristics without a buffer layer may be difficult. However, according to example embodiments, as the fixed layer structure 150 and the free layer 170 are formed on the buffer layer 140, and both the fixed layer structure 150 and the free layer 170 include a ferrimagnetic Heusler material, the buffer layer 140 and the fixed layer structure 150 may function as growth templates in an epitaxial growth process of the free layer 170, and thus the free layer 170 may have good crystal quality.

In addition, as the SOT structure 180 is a stacked structure of the second electrode layer 184 including a topological insulator material and the first electrode layer 182 for improving interfacial characteristics between the second electrode layer 184 and the free layer 170, relatively high spin-orbit coupling characteristics may be obtained by the SOT structure 180. Therefore, the magnetic memory device 100 according to the example embodiments may be capable of fast switching and a low current operation.

Hereinafter, a driving method of the magnetic memory device 100 according to example embodiments is schematically described with reference to FIGS. 4A through 4C.

Figure 4A:
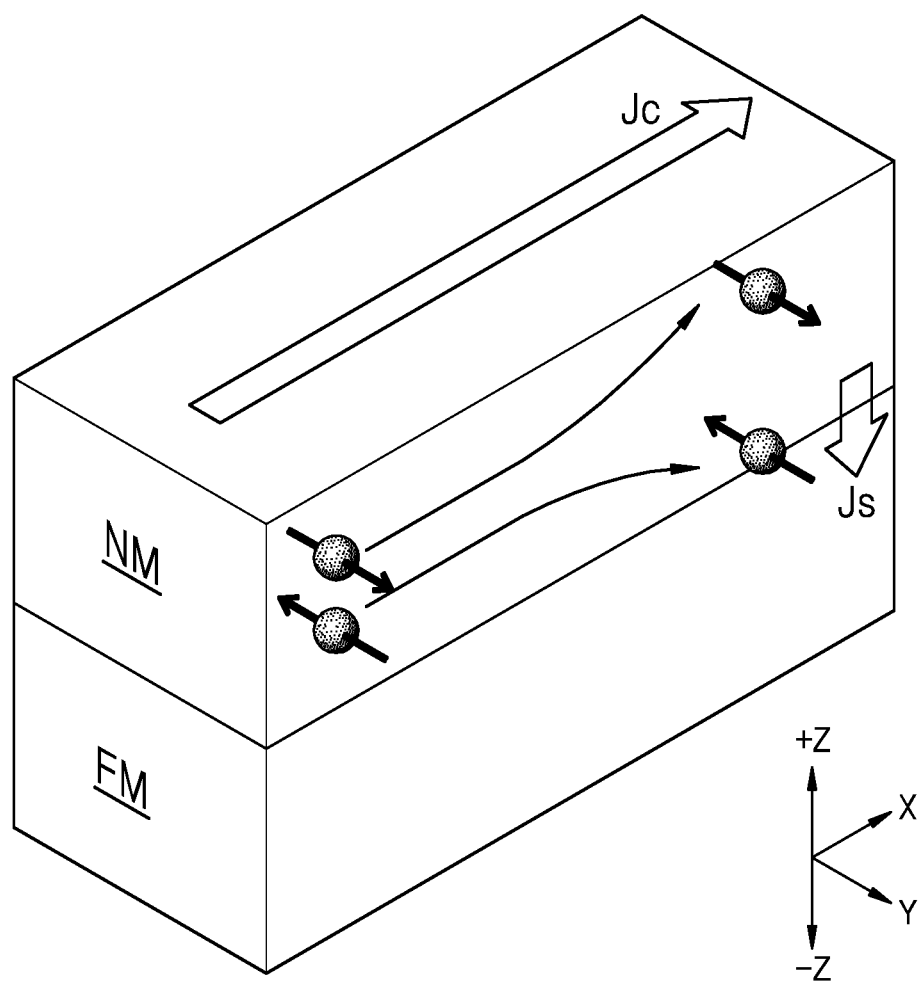
FIGS. 4A through 4C are schematic diagrams of a method of driving a magnetic memory device, according to example embodiments, respectively.

FIG. 4A schematically illustrates the spin current generated by a current in a junction structure of a non-magnetic material and a magnetic material.

Referring to FIG. 4A, after a lamination structure including a non-magnetic material layer NM and a magnetic metal layer FM is formed, a current may flow in a longitudinal direction of the non-magnetic material layer NM of the lamination structure (for example, a longitudinal direction of the lamination structure or the X direction in FIG. 4A). For example, the non-magnetic material layer NM may include the topological insulator material, and the magnetic metal layer FM may include a ferrimagnetic Heusler material. Here, a current due to charge transfer may be expressed as $J_C$. Due to strong spin-orbit coupling characteristics of the non-magnetic material layer NM, electrons which have one spin may be deflected in a transverse direction of the non-magnetic material layer NM (for example, a direction perpendicular to the longitudinal direction of the lamination structure, or a +Z direction in FIG. 4A), and electrons having opposite spins may be deflected in the other direction (for example, a −Z direction in FIG. 4A). For example, when the current flows in the X direction, an up spin may be accumulated in the +Z direction, and a down spin may be accumulated in the −Z direction, which is summarized as that a spin current is generated in the −Z direction (or the +Z direction). This spin current may be expressed as $J_S$ in FIG. 4A. In other words, when a current flows through the non-magnetic material layer NM, the spin current $J_S$ may be induced in a direction perpendicular to a direction of the current $J_C$, and a spin torque may be transferred to a ferromagnetic metal layer FM in contact with the non-magnetic material layer NM.

Figure 4B:
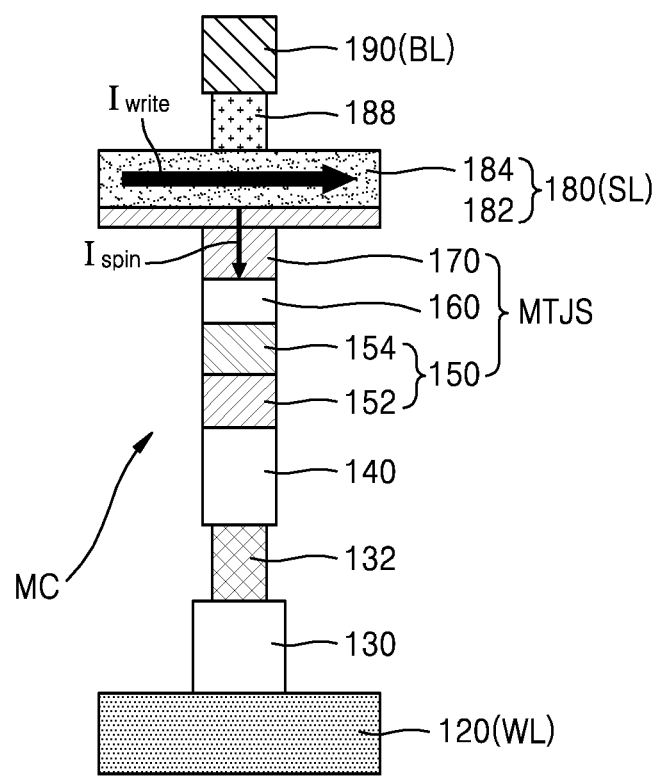
Figure 4C:
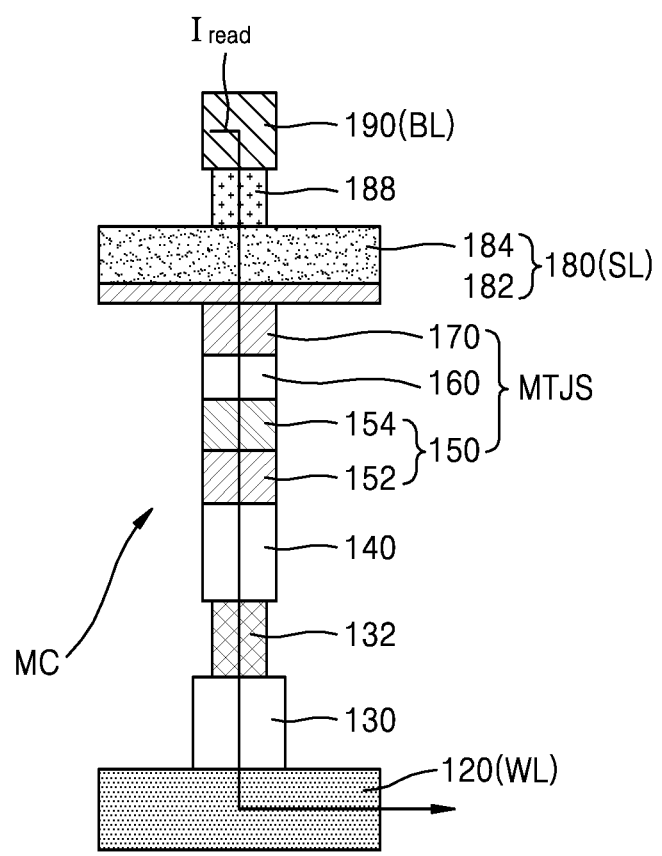

FIGS. 4B and 4C schematically illustrate a write operation and a read operation of the magnetic memory device 100 according to example embodiments, respectively.

Referring to FIG. 4B, a voltage may be applied to the first conductive line 120 to turn on the switching element 130, and a write current $I_{write}$ may be applied to the SOT structure 180. At this time, a spin current $I_{spin}$ may be generated by the spin Hall effect of the SOT structure 180 (particularly, the second electrode layer 184), and be applied to the free layer 170. The spin current $I_{spin}$ may occur in a direction perpendicular to the write current $I_{write}$. Accordingly, data may be written to the memory cell MC by the spin current $I_{spin}$.

Referring to FIG. 4C, a potential difference may be generated between the first conductive line 120 and the second conductive line 190 (that is, between the word line WL and the bit line BL). Due to this potential difference, a read current $I_{read}$ may flow through the second conductive line 190, the MTJ structure MTJS, and the first conductive line 120. A measured value of the read current $I_{read}$ may vary depending on a resistance state of the MTJ structure MTJS, that is, a magnetization direction of the free layer 170 and a magnetization direction of the fixed layer structure 150. By comparing the measured value of the read current $I_{read}$ with a comparison value, it may be possible to determine whether the MTJ structure MTJS is in a low resistance state (that is, data of 0 or 1) or a high resistance state (that is, data of 1 or 0). Accordingly, data stored in the MTJ structure MTJS may be determined.

Figure 5:
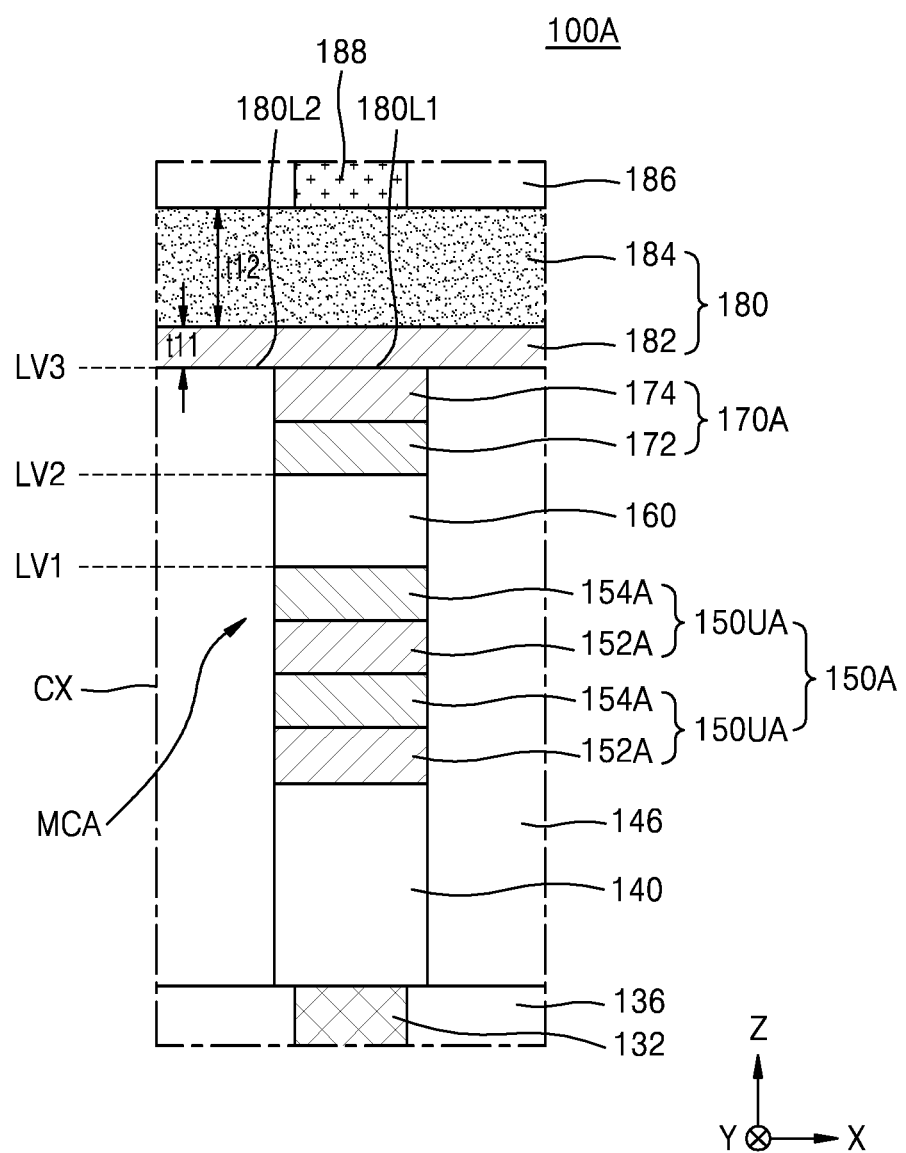
FIG. 5 is a cross-sectional view illustrating a magnetic memory device according to an example embodiment.

FIG. 5 is a cross-sectional view illustrating a magnetic memory device 100A according to an example embodiment. FIG. 5 is an enlarged cross-sectional view of a region corresponding to the region CX in FIG. 2A. In FIG. 5, the same reference numerals as those in FIGS. 1 through 4C may denote the same components.

Referring to FIG. 5, a memory cell MCA may include the buffer layer 140, a fixed layer structure 150A, the tunnel barrier 160, and a free layer 170A.

The free layer 170A may include a bottom free layer 172 on the tunnel barrier 160, and a top free layer 174 that is on the bottom free layer 172 and in contact with the bottom surface of the SOT structure 180. The top free layer 174 may have similar technical characteristics to the free layer 170 described above with reference to FIGS. 1 through 3. The top free layer 174 may include a binary ferrimagnetic Heusler material. The top free layer 174 may have the chemical formula of $Mn_aX_b$, and may include, for example, at least one of MnGa or MnGe.

The bottom free layer 172 may include the ternary ferrimagnetic Heusler material. The bottom free layer 172 may have the chemical formula of $Mn_aX_bY_c$ and may include, for example, at least one of MnGaNi, MnGeNi, MnGaCo, MnGeCo, MnGaFe, or MnGeFe. The bottom free layer 172 may have a lattice constant that is a value between a lattice constant of the tunnel barrier 160 and a lattice constant of the top free layer 174. The bottom free layer 172 may function as an intermediate layer to offset the lattice mismatch between the tunnel barrier 160 and the top free layer 174, and thus the free layer 170A may have a relatively good crystal quality.

A fixed layer structure 150A may include a plurality of fixed layer stacks 150UA. Each of the plurality of fixed layer stacks 150UA may include a bottom fixed layer 152A and a top fixed layer 154A. The bottom fixed layer 152A and the top fixed layer 154A may have similar technical characteristics to the bottom fixed layer 152 and the top fixed layer 154 described with reference to FIGS. 1 through 3, respectively. For example, the bottom fixed layer 152A may include a binary ferrimagnetic Heusler material, have the chemical formula of $Mn_aX_b$, and may include, for example, at least one of MnGa or MnGe. The top fixed layer 154A may include a ternary ferrimagnetic Heusler material, have the chemical formula of $Mn_aX_bY_c$, and include at least one of, for example, MnGaNi, MnGeNi, MnGaCo, MnGeCo, MnGaFe, or MnGeFe. In FIG. 5, two fixed layer stacks 150UA are illustrated to be stacked in the third direction (Z direction), but the number of fixed layer stacks 150UA is not limited thereto. As the fixed layer structure 150A is formed as a stacked structure including the plurality of fixed layer stacks 150UA, the fixed layer structure 150A may have a relatively high exchange coupling force, and accordingly, the fixed layer structure 150A may exhibit high perpendicular magnetic anisotropy.

In addition, the top fixed layer 154A may have a lattice constant that is a value between a lattice constant of the tunnel barrier 160 and a lattice constant of the bottom fixed layer 152A. The top fixed layer 154A may function as an intermediate layer to offset the lattice mismatch between the tunnel barrier 160 and the bottom fixed layer 152A, and thus, the top fixed layer 154A may have a relatively good crystal quality.

Although a case has been described above in which the bottom fixed layer 152A includes a binary ferrimagnetic Heusler material and the top fixed layer 154A includes a ternary ferrimagnetic Heusler material in one fixed layer stack 150UA, materials of the bottom fixed layer 152A and the top fixed layer 154A may be changed with each other within one fixed layer stack 150UA. For example, the bottom fixed layer 152A including a ternary ferrimagnetic Heusler material and arranged at a lowermost portion of the fixed layer stack 150UA may be arranged directly on the buffer layer 140, and the top fixed layer 154A, including a binary ferrimagnetic Heusler material and arranged at an uppermost portion of the fixed layer stack 150UA may be arranged directly under the tunnel barrier 160. When an element is referred to as being arranged "directly on" or "directly under" or "immediately adjacent" another element, no intervening elements are present.

According to example embodiments, the free layer 170A may have a good crystal quality, and in addition, the fixed layer structure 150A may have high perpendicular magnetic anisotropy. Thus, the magnetic memory device 100 may be capable of fast switching and a low current operation.

Figure 6:
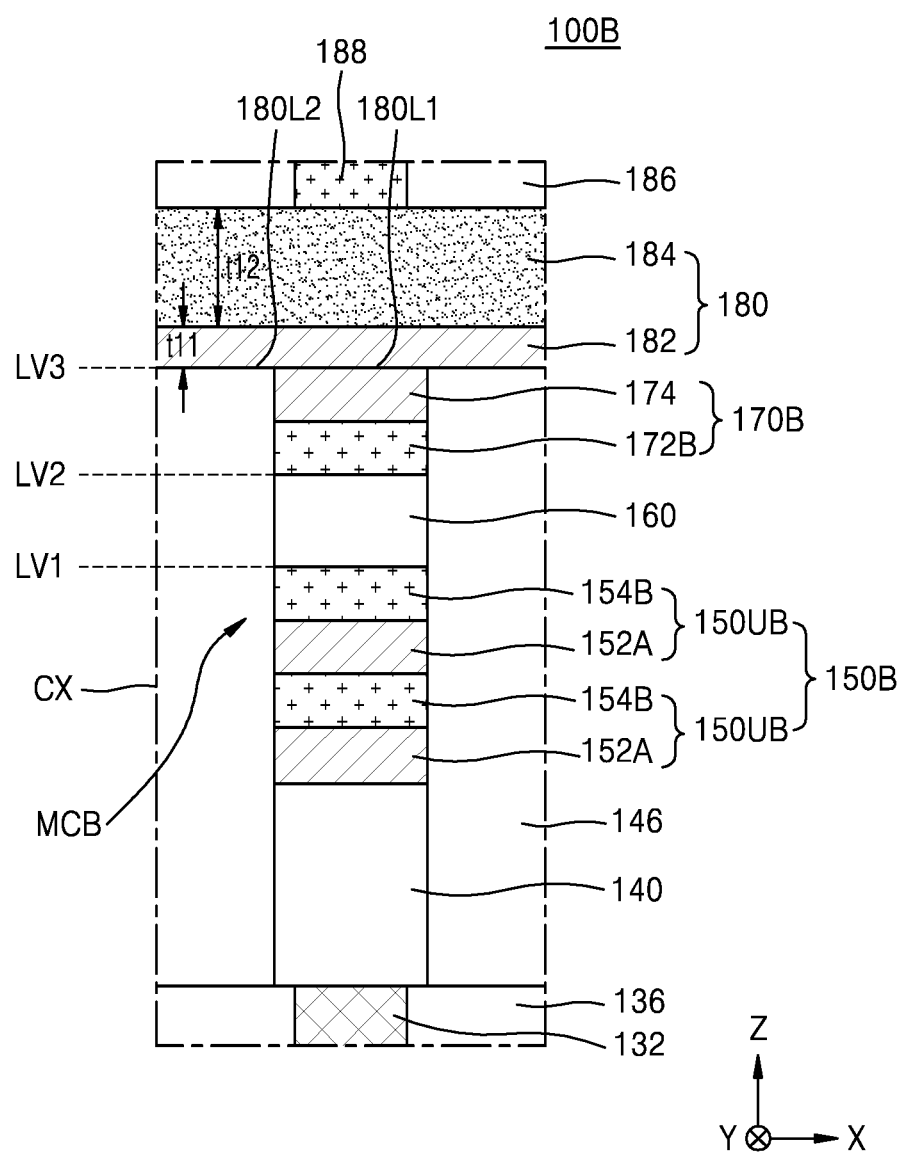
FIG. 6 is a cross-sectional view illustrating a magnetic memory device according to an example embodiment.

FIG. 6 is a cross-sectional view illustrating a magnetic memory device 100B according to an example embodiment. FIG. 6 is an enlarged cross-sectional view of a region corresponding to the region CX in FIG. 2A. In FIG. 6, the same reference numerals as those in FIGS. 1 through 5 may denote the same components.

Referring to FIG. 6, a memory cell MCB may include the buffer layer 140, a fixed layer structure 150B, the tunnel barrier 160, and a free layer 170B.

The free layer 170B may include a bottom free layer 172B on the tunnel barrier 160, and the top free layer 174 on the bottom free layer 172B and contacting the bottom surface of the SOT structure 180. The top free layer 174 may have similar technical characteristics to the free layer 170 described with reference to FIGS. 1 through 3. The top free layer 174 may include a binary ferrimagnetic Heusler material, have the chemical formula of $Mn_aX_b$, and may include at least one of, for example, MnGa or MnGe.

The bottom free layer 172B may include a ferromagnetic Heusler material. The bottom free layer 172B may have a chemical formula of $X_2YZ$ and may include at least one of, for example, $Co_2MnSi$, $Co_2MnAl$, $Co_2MnGa$, $Co_2MnGe$, $Co_2NiGa$, $Co_2FeSi$, $Co_2FeAl$, $Fe_2MnSi$, $Fe_2VSi$, $Ni_2MnAl$, $Ni_2MnIn$, or $Ni_2MnGa$. The bottom free layer 172B may have a lattice constant that is a value between a lattice constant of the tunnel barrier 160 and a lattice constant of the top free layer 174. The bottom free layer 172B may function as an intermediate layer to offset the lattice mismatch between the tunnel barrier 160 and the top free layer 174, and thus the free layer 170B may have a relatively good crystal quality.

The fixed layer structure 150B may include a plurality of fixed layer stacks 150UB. Each of the plurality of fixed layer stacks 150UB may include the bottom fixed layer 152A and a top fixed layer 154B. The bottom fixed layer 152A may have similar technical characteristics to the bottom fixed layer 152 described with reference to FIGS. 1 through 3. For example, the bottom fixed layer 152A may include a binary ferrimagnetic Heusler material, have the chemical formula of $Mn_aX_b$, and may include, for example, at least one of MnGa or MnGe.

The top fixed layer 154B may include a ferromagnetic Heusler material. The top fixed layer 154B may have a chemical formula of $X_2YZ$ and may include at least one of, for example, $Co_2MnSi$, $Co_2MnAl$, $Co_2MnGa$, $Co_2MnGe$, $Co_2NiGa$, $Co_2FeSi$, $Co_2FeAl$, $Fe_2MnSi$, $Fe_2VSi$, $Ni_2MnAl$, $Ni_2MnIn$, or $Ni_2MnGa$.

The top fixed layer 154B may have a lattice constant that is a value between a lattice constant of the tunnel barrier 160 and a lattice constant of the bottom fixed layer 152A. The top fixed layer 154B may function as an intermediate layer to offset the lattice mismatch between the tunnel barrier 160 and the bottom fixed layer 152A, and thus, the top fixed layer 154B may have a relatively good crystal quality. As the fixed layer structure 150B has a stacked structure including a plurality of fixed layer stacks 150UB, the fixed layer structure 150B may have a relatively high exchange coupling force, and accordingly, the fixed layer structure 150B may exhibit high perpendicular magnetic anisotropy.

According to example embodiments, the free layer 170B may have a good crystal quality, and in addition, the fixed layer structure 150B may have high perpendicular magnetic anisotropy. Therefore, the magnetic memory device 100B may be capable of fast switching and a low current operation.

Figure 7:
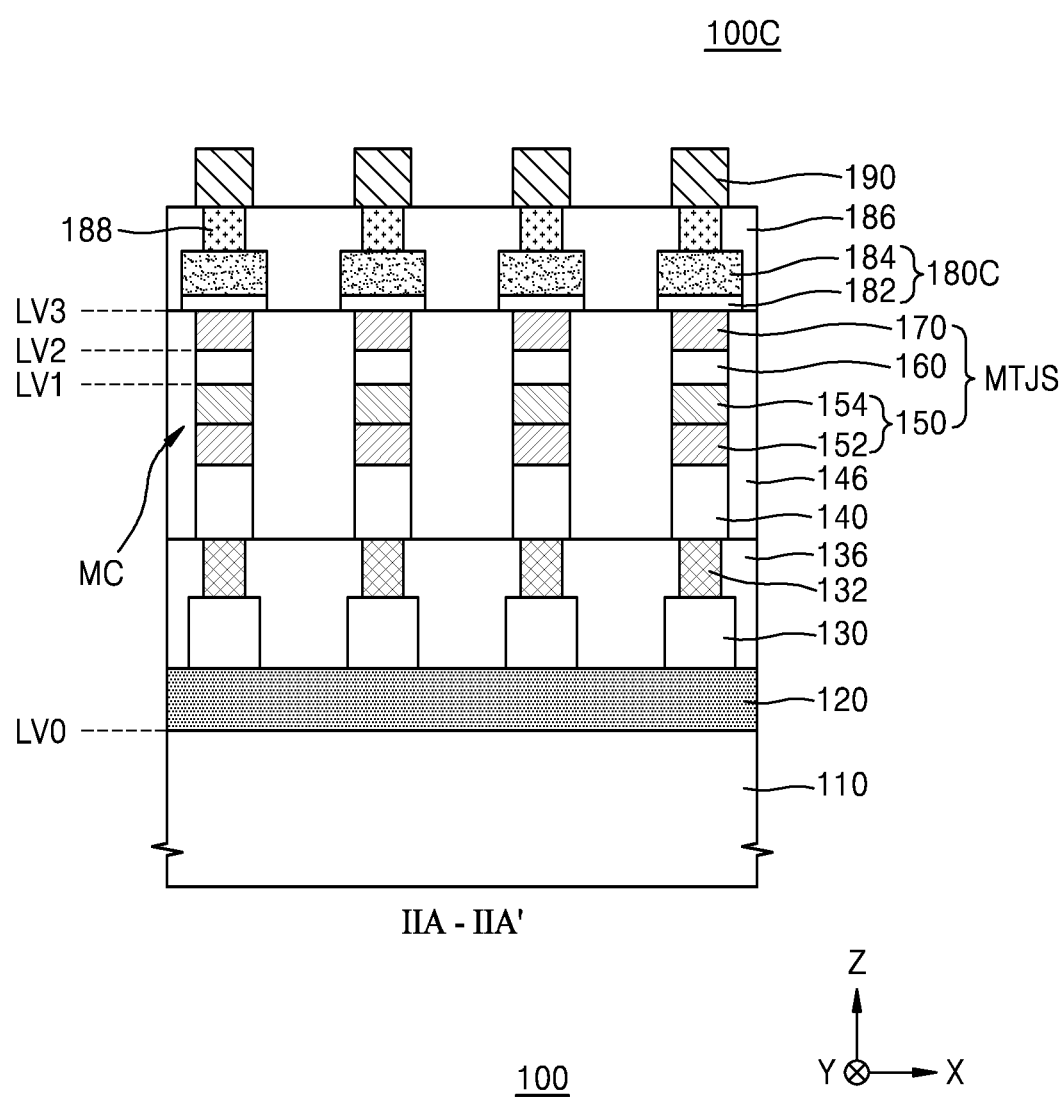
FIG. 7 is a cross-sectional view illustrating a magnetic memory device according to an example embodiment.

FIG. 7 is a cross-sectional view illustrating a magnetic memory device 100C according to an example embodiment. FIG. 7 is a cross-sectional view of a region corresponding to the line IIA-IIA' in FIG. 1. In FIG. 7, the same reference numerals as those in FIGS. 1 through 6 may denote the same components.

Referring to FIG. 7, an SOT structure 180C may extend in a second direction (Y direction) parallel to the top surface of the substrate 110, and the second conductive line 190 may extend at a higher level than the SOT structure 180C in the second direction (Y direction). A plurality of contacts 188 for electrically connecting the second conductive line 190 to the SOT structure 180C may be arranged through the second interlayer insulating layer 186.

According to example embodiments, the SOT structure 180C including the topological insulator material may have a relatively low resistivity and be apart from the second conductive line 190, and the amount of current flowing in the SOT structure 180C may be increased compared with a case, for example, in which the second conductive line 190 and the SOT structure 180C are formed in a stacked manner or in contact with each other. Therefore, the magnetic memory device 100C may be capable of fast switching and a low current operation.

FIGS. 8 through 13 are cross-sectional views illustrating a method of manufacturing the magnetic memory device 100, according to example embodiments, respectively. In FIGS. 8 through 13, cross-sections of the region corresponding to the line IIA-IIA' in FIG. 1 are illustrated in an order of processes. In FIGS. 8 through 13, the same reference numerals as those in FIGS. 1 through 7 may denote the same components.

Figure 8:
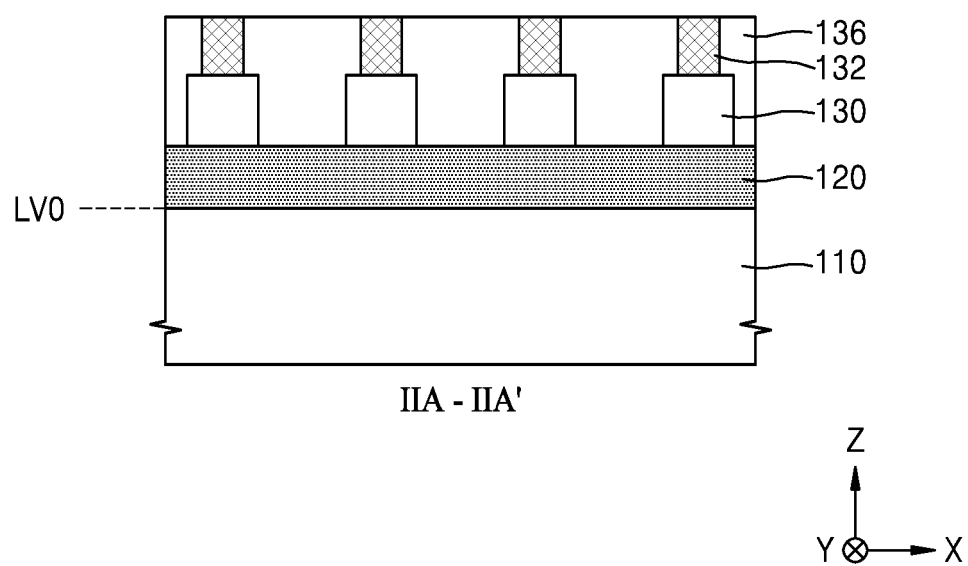
FIGS. 8 through 13 are cross-sectional views illustrating a method of manufacturing a magnetic memory device, according to example embodiments, respectively.

Referring to FIG. 8, the first conductive line 120 and the switching element 130 may be formed on the substrate 110.

The substrate 110 may include a semiconductor substrate such as a silicon (Si) substrate, a germanium (Ge) substrate, a silicon carbide (SiC) substrate, a gallium arsenide (GaAs) substrate, and/or an indium arsenide (InAs) substrate. An intermediate layer such as an interlayer insulating film may be further arranged on the substrate 110.

A conductive layer may be formed on the substrate 110 by using doped polysilicon, a metal, or a metal nitride, and the first conductive line 120 may be formed by patterning the conductive layer. The switching element 130 may be formed on the first conductive line 120.

In example embodiments, the switching element 130 may include a PMOS transistor or an NMOS transistor. The substrate 110 may include a conductive region or, for example, an impurity-doped well or an impurity-doped structure, an isolation layer of a shallow trench isolation (STI) structure may be further formed, and a bottom insulation layer may be further formed on the substrate 110. The conductive region may constitute or define a portion of the switching element 130.

In other embodiments, the switching element 130 may include diodes. In this case, by growing a p-type semiconductor layer and an n-type semiconductor layer successively epitaxially on the first conductive line 120, or by growing an n-type semiconductor layer and a p-type semiconductor layer successively epitaxially on the first conductive line 120, the switching element 130 may be formed.

The first interlayer insulating layer 136 covering the first conductive line 120 and the switching element 130 may be formed. After removing a portion of the first interlayer insulating layer 136 to form a bottom electrode opening that exposes the top surface of the switching element 130, the bottom electrode 132 may be formed by filling a metal material or a metal nitride in the bottom electrode opening.

By selectively performing a planarization process on the first interlayer insulating layer 136 and the bottom electrode 132, the upper surfaces of the first interlayer insulating layer 136 may be coplanar with the bottom electrode 132.

Figure 9:
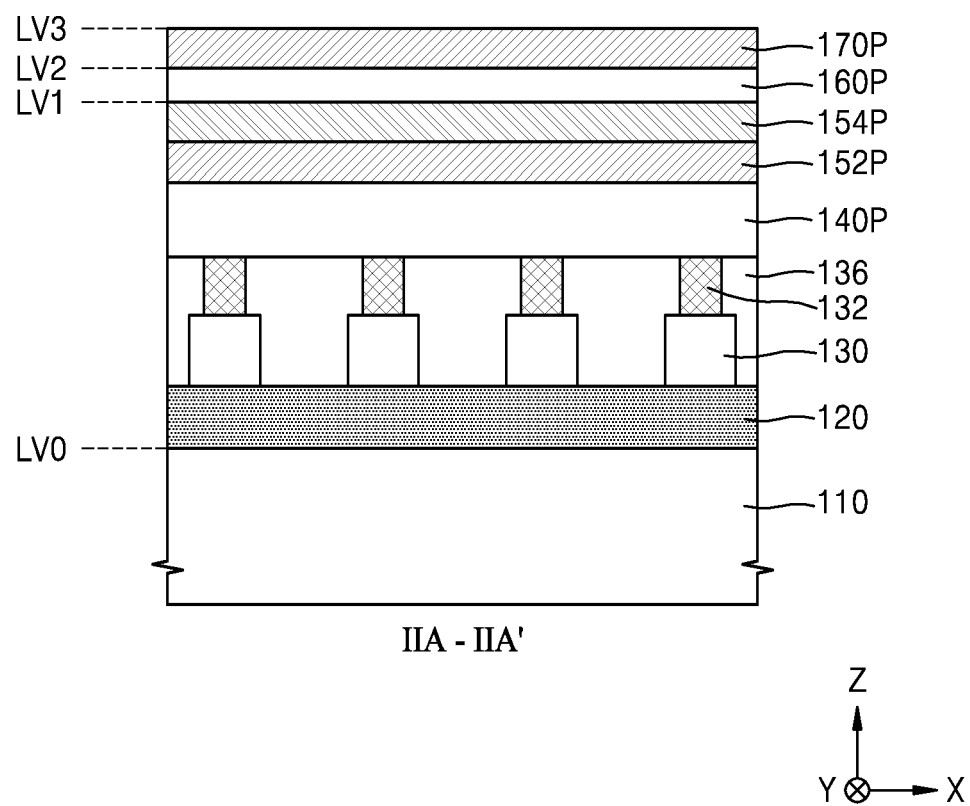

As shown in FIG. 9, the preliminary buffer layer 140P, the preliminary bottom fixed layer 152P, the preliminary top fixed layer 154P, the preliminary tunnel barrier 160P, and the preliminary free layer 170P may be sequentially formed on the first interlayer insulating layer 136 and the bottom electrode 132.

The preliminary buffer layer 140P, the preliminary bottom fixed layer 152P, the preliminary top fixed layer 154P, the preliminary tunnel barrier 160P, and the preliminary free layer 170P may be formed by a sputtering process, a chemical vapor deposition (CVD) process, a metal-organic CVD process, an atomic layer deposition (ALD) process, a molecular beam epitaxy process, etc.

The preliminary buffer layer 140P may be formed by using a non-magnetic metal material (such as chromium (Cr), ruthenium (Ru), and/or tantalum (Ta)), a non-magnetic compound (such as cobalt gallium (CoGa) and/or manganese gallium nitride (MnGaN)), and/or a non-magnetic alloy (such as nickel aluminum (NiAl)). The preliminary buffer layer 140P may function as a template for epitaxial growth of the preliminary bottom fixed layer 152P formed thereon. A thickness and a lattice constant in the third direction (Z direction) of the preliminary buffer layer 140P may be suitably selected to reduce a mismatch of a lattice constant between the preliminary bottom fixed layer 152P and the preliminary top fixed layer 154P.

The preliminary bottom fixed layer 152P may be formed by using at least one of MnGa or MnGe. The preliminary top fixed layer 154P may be formed by using at least one of MnGaNi, MnGeNi, MnGaCo, MnGeCo, MnGaFe, or MnGeFe.

The preliminary tunnel barrier 160P and the preliminary free layer 170P may be sequentially formed on the preliminary top fixed layer 154P. In a process of forming the preliminary tunnel barrier 160P, the preliminary top fixed layer 154P exposed at the bottom of the preliminary tunnel barrier 160P may include a material having a relatively small lattice mismatch with the preliminary tunnel barrier 160P, and accordingly, the crystal quality of the preliminary tunnel barrier 160P and/or an interfacial quality between the preliminary top fixed layer 154P and the preliminary tunnel barrier 160P may be good.

The preliminary free layer 170P may be formed by using at least one of MnGa or MnGe, may have a tetragonal crystal phase, and may be formed to have the $D0_{22}$ crystal structure, for example. In a process of forming the preliminary free layer 170P on the preliminary tunnel barrier 160P, the preliminary top fixed layer 154P under the preliminary tunnel barrier 160P may function as a template for epitaxial growth of the preliminary free layer 170P because the preliminary tunnel barrier 160P has a relatively small thickness. Therefore, the crystal quality of the preliminary free layer 170P and/or the interfacial quality between the preliminary tunnel barrier 160P and the preliminary free layer 170P may be good.

Figure 10:
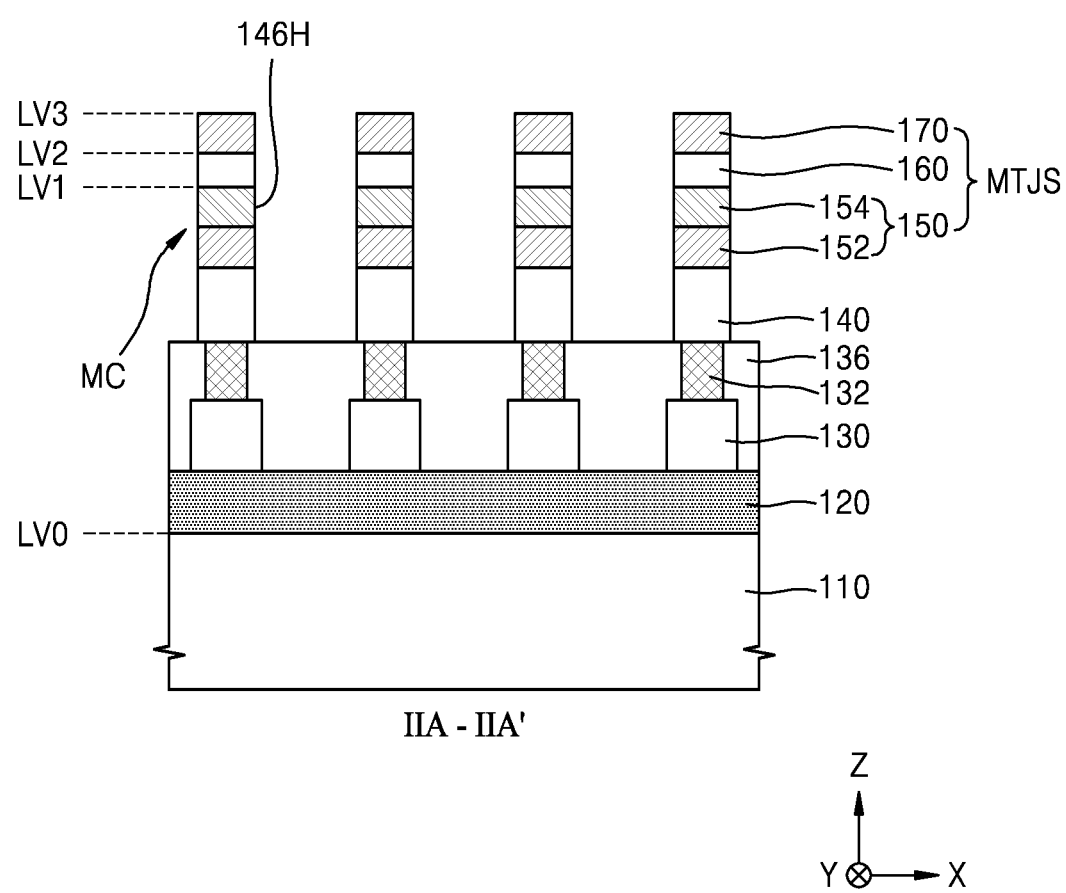

Referring to FIG. 10 together with FIG. 9, a mask pattern may be formed on the preliminary buffer layer 140P, the preliminary bottom fixed layer 152P, the preliminary top fixed layer 154P, the preliminary tunnel barrier 160P, and the preliminary free layer 170P. By using the mask pattern as an etching mask to pattern sequentially the preliminary free layer 170P, the preliminary tunnel barrier 160P, the preliminary top fixed layer 154P, the preliminary bottom fixed layer 152P, and the preliminary buffer layer 140P, the memory cell MC including the buffer layer 140 and the MTJ structure MTJS may be formed. The MTJ structure MTJS may include the fixed layer structure 150, the tunnel barrier 160, and the free layer 170, that are formed on the buffer layer 140, and the fixed layer structure 150 may include the bottom fixed layer 152 and the top fixed layer 154.

By the patterning, an opening 146H may be formed in a space between one memory cell MC and another memory cell MC adjacent thereto. The sidewalls of the buffer layer 140, the sidewalls of the fixed layer structure 150, the sidewalls of the tunnel barrier 160, and the sidewalls of the free layer 170 may be aligned with respect to each other in straight lines. The top surface of the first interlayer insulating layer 136 may be exposed to a bottom of the opening 146H.

Also, an over-etching process may be performed in the patterning to properly electrically and physically separate one memory cell MC from another memory cell MC adjacent thereto. As a result of the over-etching process, a recess may be further formed on the first interlayer insulating layer 136 and the top surface of the first interlayer insulating layer 136 may be locally at a lower level than the top surface of the bottom electrode 132.

According to a general SOT-type MRAM device, an SOT line SL may be formed under the MTJ structure MTJS, and in this case, etching damage to a top surface of the SOT line SL may occur in the patterning to form the MTJ structure MTJS. However, according to the inventive concepts, an SOT structure 180 may not be etch-damaged in the patterning to form the MTJ structure MTJS.

Figure 11:
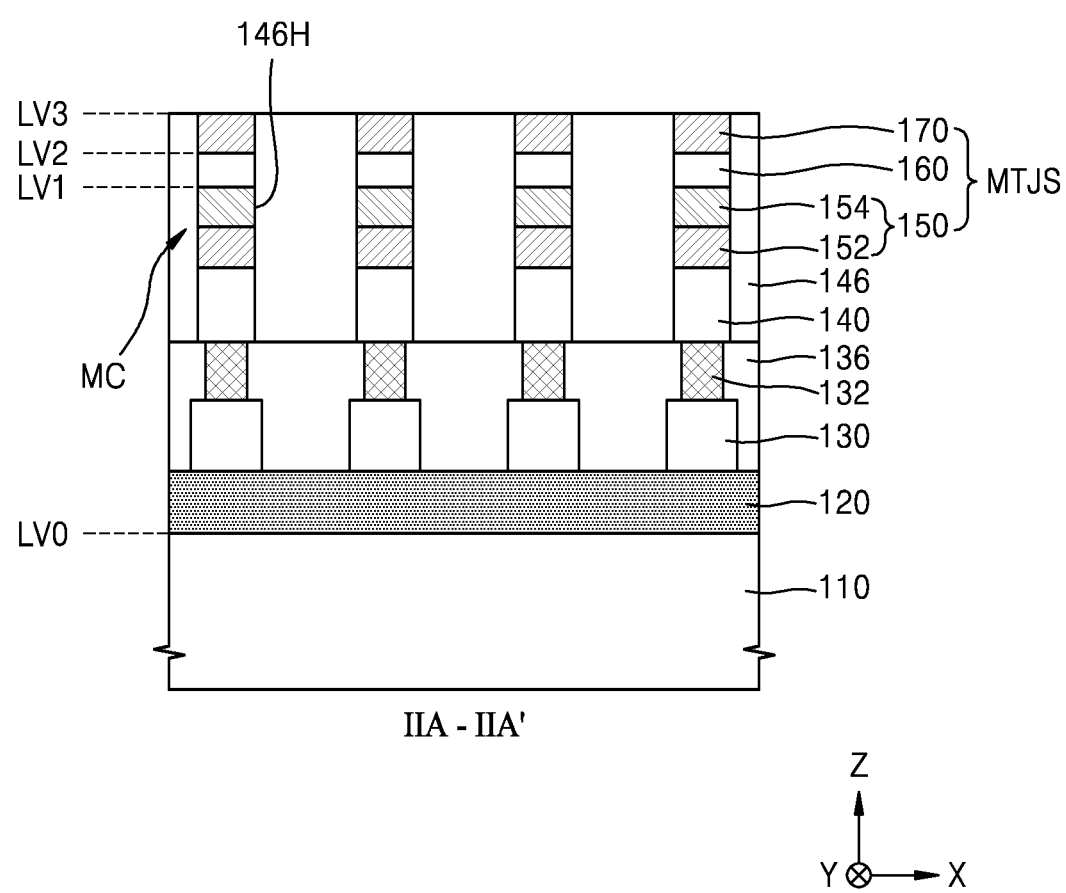

Referring to FIG. 11, an insulating layer may be formed on the first interlayer insulating layer 136 and the memory cell MC to fill the opening 146H, and then, the insulating pattern 146 may be formed by planarizing the insulating layer so that the top surface of the free layer 170 is exposed. The insulating pattern 146 may surround the sidewalls of the buffer layer 140 and the sidewalls of the MTJ structure MTJS.

In FIGS. 9 through 11, example embodiments have been described in which the memory cell MC and the insulating pattern 146 are formed by performing one patterning process and one insulating layer-forming process. However, according to other embodiments, the memory cell MC and the insulating pattern 146 may be formed by performing two or more patterning processes and two or more insulating layer-forming processes. For example, after forming firstly the preliminary buffer layer 140P, the preliminary bottom fixed layer 152P, and the preliminary top fixed layer 154P, a bottom stack may be formed by patterning the preliminary buffer layer 140P, the preliminary bottom fixed layer 152P, and the preliminary top fixed layer 154P, and a bottom insulating pattern surrounding the bottom stack may be formed. The preliminary tunnel barrier 160P and the preliminary free layer 170P may be formed on the bottom stack and the bottom insulating pattern, a top stack may be formed by patterning the preliminary tunnel barrier 160P and the preliminary free layer 170, and a top insulating pattern surrounding the top stack (or the patterned preliminary tunnel barrier 160P and the patterned preliminary free layer 170) may be formed.

Figure 12:
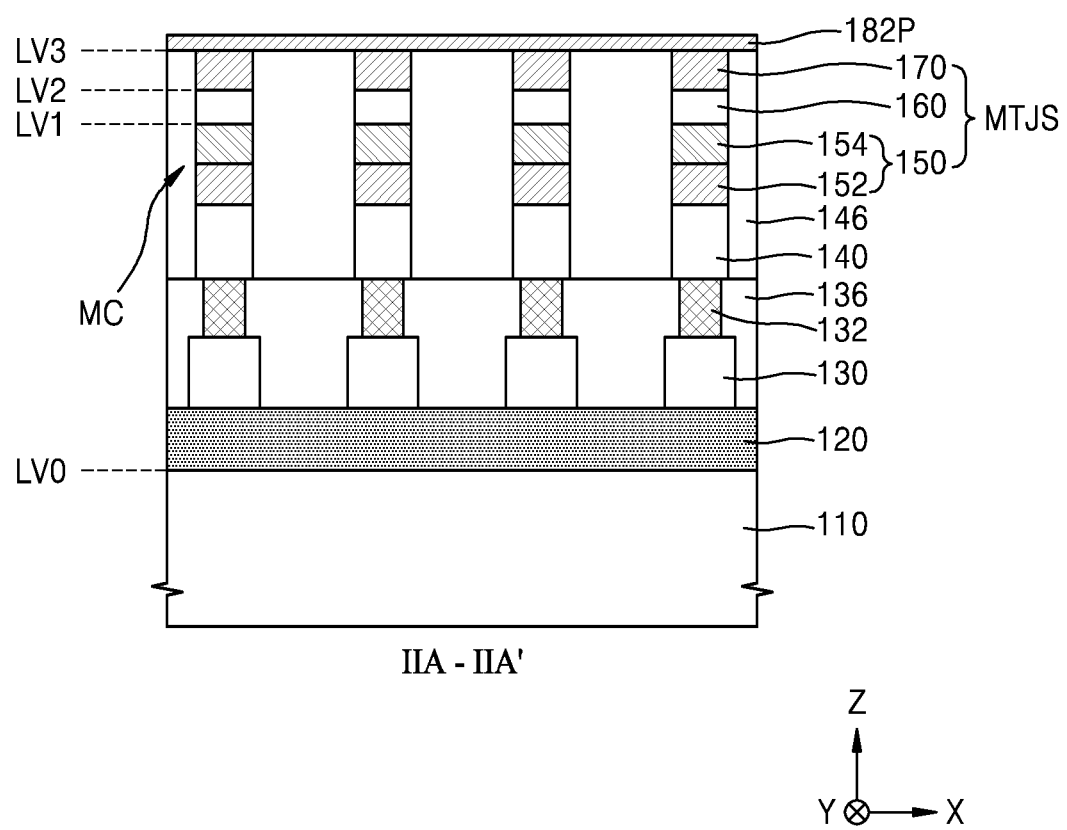

Referring to FIG. 12, a preliminary first electrode layer 182P may be formed on the top surfaces of the MTJ structure MTJS and the insulating pattern 146. The preliminary first electrode layer 182P may be formed with the thickness t11 (refer to FIG. 3) of about 1 to about 10 nm by using at least one of MnGe or MnGa. The preliminary first electrode layer 182P may be formed by an epitaxial growth process by using the top surface of the free layer 170 thereunder as a template.

Figure 13:
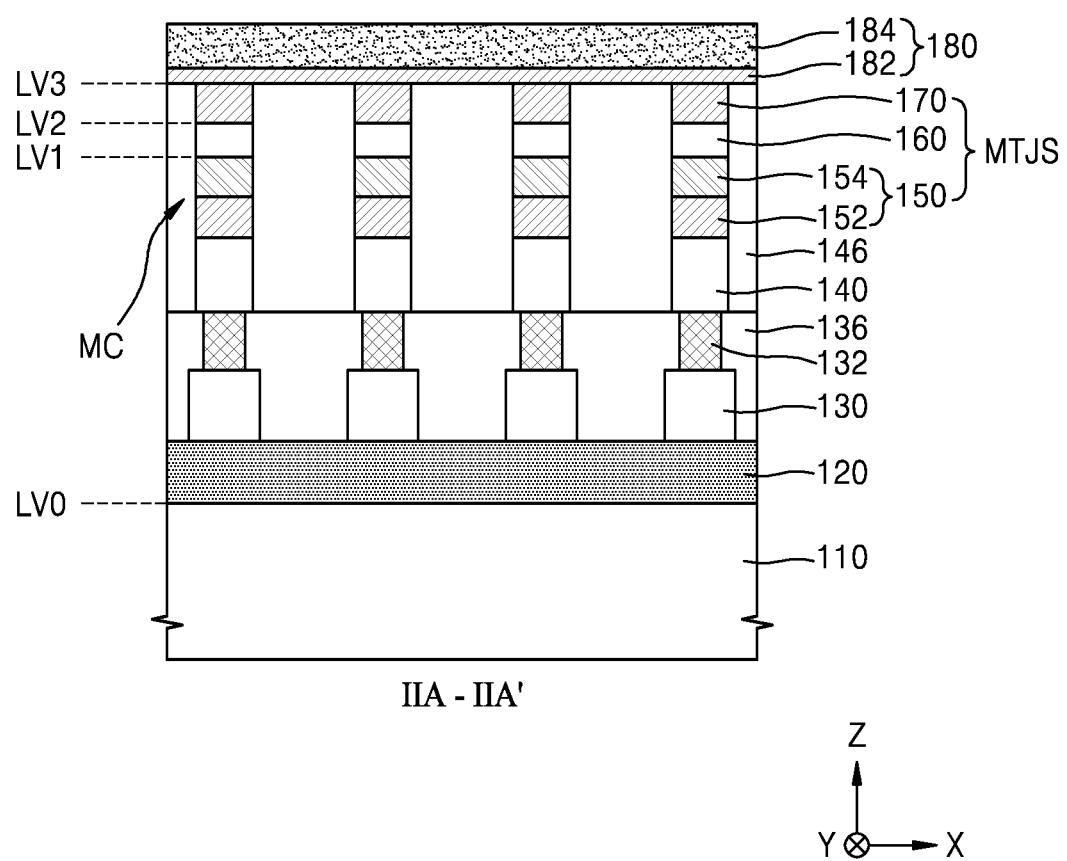

Referring to FIG. 13, a preliminary second electrode layer may be formed on the preliminary first electrode layer 182P (refer to FIG. 12). A mask pattern may be formed on the preliminary second electrode layer, and by using the mask pattern as an etch mask to pattern sequentially the preliminary second electrode layer and the preliminary first electrode layer 182P, the SOT structure 180 including the second electrode layer 184 and the first electrode layer 182 may be formed. The mask pattern may have a linear or line shape extending in the second direction (Y direction).

The preliminary second electrode layer may be formed by using a topological insulator material, for example, at least one of bismuth antimony ($Bi_{1-x}Sb_x$, where x is about 0.05 to about 0.25) or bismuth selenium ($Bi_{1-y}Se_y$, where y is about 0.05 to about 0.25). The preliminary second electrode layer may have a hexagonal crystal phase. The preliminary second electrode layer may be formed to have a relatively high crystal quality and a relatively high flatness on the preliminary first electrode layer 182P having a tetragonal crystal phase. In addition, as the preliminary second electrode layer is not directly arranged on the top surface of the insulating pattern 146 but formed on the preliminary first electrode layer 182P, an interface quality between the free layer 170 and the SOT structure 180 (for example, the interface quality between the free layer 170 and the preliminary first electrode layer 182P, and/or the interface quality between the preliminary first electrode layer 182P and the preliminary second electrode) may be good.

Referring again to FIG. 2A, by forming an insulating layer covering the SOT structure 180 on the insulating pattern 146 and planarizing a top surface of the insulating layer so that the top surface of the SOT structure 180 is exposed, the second interlayer insulating layer 186 may be formed. By removing a portion of the second interlayer insulating layer 186 to form the plurality of openings, and by using a metal or a metal nitride, the plurality of contacts 188 may be formed inside the plurality of openings 146H. By using a metal or a metal nitride on the plurality of contacts 188 and the second interlayer insulating layer 186 to form a conductive layer, and by patterning the conductive layer, the second conductive line 190 may be formed.

The magnetic memory device 100 may be completed by performing the above-described processes.

Generally, in an SOT-type MRAM device, an SOT line may be on a switching element, and an MTJ structure may be on the SOT line. However, in an etching process of patterning the MTJ structure MTJS, etching residues that generally include heavy metal materials may be re-deposited on patterned sidewalls to cause a short between a free layer and a fixed layer, and a top surface of the SOT line exposed to an etching environment may be damaged by an etching gas or an etchant. However, according to example embodiments, as the SOT structure 180 is arranged on the MTJ structure MTJS, the SOT structure 180 may be prevented from being damaged in a patterning process of the MTJ structure MTJS.

In addition, in a general SOT-type MRAM device, since the SOT line and the free layer need to contact each other without an additional material layer therebetween, the free layer, a tunnel barrier, and the fixed layer may be on the SOT line. In such a case, it is difficult to position the buffer layer for improving the crystallinity of the free layer, and accordingly, the quality of the free layer is low or selection of a material to be included in the free layer is limited. However, according to example embodiments, the preliminary bottom fixed layer 152P and the preliminary top fixed layer 154P, that include a ferrimagnetic Heusler material, may be formed on the preliminary buffer layer 140P, and the preliminary free layer 170P may be formed on the preliminary tunnel barrier 160P. Accordingly, since in the epitaxial growth process of the preliminary free layer 170P, the preliminary buffer layer 140P, the preliminary bottom fixed layer 152P, and the preliminary top fixed layer 154P all function as growth templates, the free layer 170 may have a good crystal quality.

In addition, since the SOT structure 180 is formed in a stacked structure including the second electrode layer 184 and the first electrode layer 182, that include the topological insulator, the second electrode layer 184 may have a good crystal quality and interface quality. Therefore, the magnetic memory device 100 formed by methods described above may be capable of fast switching and a low current operation.

In the process described with reference to FIG. 9, the preliminary bottom fixed layer 152A and the preliminary top fixed layer 154A may be alternately formed on the preliminary buffer layer 140P for a plurality of times. In addition, the bottom free layer 172 may be formed by using a ternary ferrimagnetic Heusler material on the preliminary tunnel barrier 160P, and then the top free layer 174 may be formed.

In this case, the magnetic memory device 100A described with reference to FIG. 5 may be obtained.

In addition, in the process described with reference to FIG. 9, the preliminary bottom fixed layer 152B and the bottom free layer 172B may be formed by using a ferromagnetic Heusler material. In this case, the magnetic memory device 100B described with reference to FIG. 6 may be obtained.

As described above, embodiments have been disclosed in the drawings and the specification. While embodiments have been described herein with reference to specific terms, it should be understood that they have been used only for the purpose of describing the technical idea of the inventive concepts and not for limiting the scope of the inventive concepts as defined in the claims. Thus, those with ordinary skill in the art will appreciate that various modifications and equivalent embodiments are possible without departing from the scope of the inventive concepts, the scope of protection of the inventive concepts being set forth by the appended claims.

What is claimed is:

1. A magnetic memory device comprising:
a buffer layer on a substrate;
a magnetic tunnel junction structure on the buffer layer, the magnetic tunnel junction structure comprising a fixed layer structure, a tunnel barrier, and a free layer that are sequentially stacked on the buffer layer; and
a spin-orbit torque (SOT) structure on the magnetic tunnel junction structure, the SOT structure comprising a topological insulator material,
wherein the free layer comprises a Heusler material.

2. The magnetic memory device of claim 1, wherein the Heusler material comprises a ferrimagnetic Heusler material, and the ferrimagnetic Heusler material comprises at least one of MnGa or MnGe.

3. The magnetic memory device of claim 1, wherein the Heusler material comprises an Mn-based alloy comprising a tetragonal crystal phase, and the Mn-based alloy comprising the tetragonal crystal phase has a $D0_{22}$ crystal structure.

4. The magnetic memory device of claim 1, wherein the topological insulator material comprises at least one of $Bi_{1-x}Sb_x$ where x is about 0.05 to about 0.25, or $Bi_{1-y}Se_y$ where y is about 0.05 to about 0.25.

5. The magnetic memory device of claim 1, wherein the SOT structure comprises:
a first electrode layer on the magnetic tunnel junction structure and comprising a ferrimagnetic Heusler material; and
a second electrode layer on the first electrode layer and comprising the topological insulator material.

6. The magnetic memory device of claim 1, wherein an entire top surface of the free layer contacts a bottom surface of the SOT structure.

7. The magnetic memory device of claim 1, wherein the fixed layer structure comprises:
a bottom fixed layer on the buffer layer and comprising a binary ferrimagnetic Heusler material; and
a top fixed layer on the bottom fixed layer and comprising at least one of a ternary ferrimagnetic Heusler material or a ferromagnetic Heusler material,
wherein the binary ferrimagnetic Heusler material comprises at least one of MnGa or MnGe, the ternary ferrimagnetic Heusler material comprises at least one of MnGaNi, MnGeNi, MnGaCo, MnGeCo, MnGaFe, or MnGeFe, and the ferromagnetic Heusler material comprises at least one of $Co_2MnSi$, $Co_2MnAl$, $Co_2MnGa$, $Co_2MnGe$, $Co_2NiGa$, $Co_2FeSi$, $Co_2FeAl$, $Fe_2MnSi$, $Fe_2VSi$, $Ni_2MnAl$, $Ni_2MnIn$, or $Ni_2MnGa$.

8. The magnetic memory device of claim 1, wherein the fixed layer structure comprises a plurality of fixed layer stacks, and each of the plurality of fixed layer stacks comprises:
a bottom fixed layer comprising a binary ferrimagnetic Heusler material; and
a top fixed layer on the bottom fixed layer and comprising at least one of a ternary ferrimagnetic Heusler material or a ferromagnetic Heusler material having a lattice constant between that of the tunnel barrier and that of the bottom fixed layer.

9. The magnetic memory device of claim 1, wherein the free layer comprises:
a bottom free layer on the tunnel barrier; and
a top free layer on the bottom free layer and contacting a bottom surface of the SOT structure,
wherein the bottom free layer comprises at least one of a ternary ferrimagnetic Heusler material or a ferromagnetic Heusler material having a lattice constant between that of the tunnel barrier and that of the top free layer, and the top free layer comprises a binary ferrimagnetic Heusler material.

10. The magnetic memory device of claim 1, further comprising:
a plurality of first conductive lines between the substrate and the buffer layer and extending in a first direction parallel with a top surface of the substrate;
a plurality of second conductive lines on the plurality of first conductive lines and extending in a second direction parallel with the top surface of the substrate and perpendicular to the first direction; and
a plurality of memory cells respectively arranged between intersections of the plurality of first conductive lines and the plurality of second conductive lines, wherein each of the plurality of memory cells comprises the buffer layer and the magnetic tunnel junction structure.

11. The magnetic memory device of claim 1, further comprising:
an insulating pattern on the substrate and extending on a sidewall of the buffer layer and a sidewall of the magnetic tunnel junction structure, wherein a bottom surface of the SOT structure contacts a top surface of the insulating pattern.

12. The magnetic memory device of claim 1, wherein, with respect to a top surface of the substrate, a bottom surface of the SOT structure is at a higher level than a top surface of the tunnel barrier, and a top surface of the free layer is at a higher level than a top surface of the fixed layer structure.

13. A magnetic memory device comprising:
a buffer layer on a substrate;
a magnetic tunnel junction structure on the buffer layer, the magnetic tunnel junction structure comprising a fixed layer structure, a tunnel barrier, and a free layer, which are sequentially stacked on the buffer layer; and
a spin-orbit torque (SOT) structure on the magnetic tunnel junction structure, the SOT structure comprising:
a first electrode layer on the magnetic tunnel junction structure and comprising a ferrimagnetic Heusler material; and
a second electrode layer on the first electrode layer and comprising a topological insulator material.

14. The magnetic memory device of claim 13, wherein, with respect to a top surface of the substrate, a bottom surface of the SOT structure is at a higher level than a top surface of the tunnel barrier, and a top surface of the free layer is at a higher level than a top surface of the fixed layer structure.

15. The magnetic memory device of claim 13, wherein the first electrode layer has a first thickness in a direction perpendicular to a top surface of the substrate, and the second electrode layer has a second thickness greater than the first thickness in the direction perpendicular to the top surface of the substrate.

16. The magnetic memory device of claim 13, further comprising:
an insulating pattern arranged on the substrate and extending on a sidewall of the buffer layer and a sidewall of the magnetic tunnel junction structure, wherein a bottom surface of the first electrode layer contacts a top surface of the insulating pattern and a top surface of the free layer.

17. The magnetic memory device of claim 16, wherein an entire bottom surface of the second electrode layer contacts the first electrode layer, and the second electrode layer does not contact the insulating pattern.

18. A magnetic memory device comprising:
a buffer layer on a substrate;
a fixed layer structure on the buffer layer and comprising a first ferrimagnetic Heusler material;
a tunnel barrier on the fixed layer structure;
a free layer on the tunnel barrier and comprising a second ferrimagnetic Heusler material; and
a spin-orbit torque (SOT) structure on the free layer opposite the substrate and comprising a topological insulator material.

19. The magnetic memory device of claim 18, further comprising:
an insulating pattern on the substrate and extending on a sidewall of the buffer layer, a sidewall of the fixed layer structure, a sidewall of the tunnel barrier, and a sidewall of the free layer, wherein a bottom surface of the SOT structure contacts a top surface of the insulating pattern and a top surface of the free layer.

20. The magnetic memory device of claim 18, further comprising:
a plurality of first conductive lines between the substrate and the buffer layer, and extending in a first direction parallel to a top surface of the substrate;
a plurality of second conductive lines on the plurality of first conductive lines, and extending in a second direction parallel with the top surface of the substrate and perpendicular to the first direction; and
a plurality of memory cells respectively arranged between intersections of the plurality of first conductive lines and the plurality of second conductive lines, wherein each of the plurality of memory cells comprises the buffer layer, the fixed layer structure, the tunnel barrier, and the free layer.

* * * * *